United States Patent
Lenski et al.

(10) Patent No.: US 7,981,740 B2
(45) Date of Patent: Jul. 19, 2011

(54) ENHANCED CAP LAYER INTEGRITY IN A HIGH-K METAL GATE STACK BY USING A HARD MASK FOR OFFSET SPACER PATTERNING

(75) Inventors: Markus Lenski, Dresden (DE); Kerstin Ruttloff, Hainichen (DE); Martin Mazur, Pulsnitz (DE); Frank Seliger, Dresden (DE); Ralf Otterbach, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/821,583

(22) Filed: Jun. 23, 2010

(65) Prior Publication Data

US 2010/0330757 A1    Dec. 30, 2010

(30) Foreign Application Priority Data

Jun. 30, 2009   (DE) .......................... 10 2009 031 110

(51) Int. Cl.
*H01L 21/8238* (2006.01)
*H01L 21/336* (2006.01)

(52) U.S. Cl. ................. 438/229; 438/299; 257/E21.635; 257/E21.616

(58) Field of Classification Search .................. 438/229, 438/299; 257/E21.635, E21.616
See application file for complete search history.

(56) References Cited

U.S. PATENT DOCUMENTS

| 2005/0035409 | A1 | 2/2005 | Ko et al. | 257/350 |
| 2005/0048752 | A1* | 3/2005 | Doris et al. | 438/595 |
| 2008/0102573 | A1* | 5/2008 | Liang et al. | 438/231 |

OTHER PUBLICATIONS

Translation of Official Communication from German Patent Office for German Patent Application No. 10 2009 031 110.6 dated May 4, 2010.

* cited by examiner

Primary Examiner — Alexander G Ghyka
Assistant Examiner — Seahvosh J Nikmanesh
(74) Attorney, Agent, or Firm — Williams, Morgan & Amerson, P.C.

(57) ABSTRACT

When forming transistor elements on the basis of sophisticated high-k metal gate structures, the efficiency of a replacement gate approach may be enhanced by more efficiently adjusting the gate height of transistors of different conductivity type when the dielectric cap layers of transistors may have experienced a different process history and may thus require a subsequent adaptation of the final cap layer thickness in one type of the transistors. For this purpose, a hard mask material may be used during a process sequence for forming offset spacer elements in one gate electrode structure while covering another gate electrode structure.

21 Claims, 8 Drawing Sheets

ENHANCED CAP LAYER INTEGRITY IN A HIGH-K METAL GATE STACK BY USING A HARD MASK FOR OFFSET SPACER PATTERNING

BACKGROUND OF THE INVENTION

1. Field of the Invention

Generally, the present disclosure relates to the fabrication of sophisticated integrated circuits including transistor elements comprising highly capacitive gate structures on the basis of a high-k gate dielectric material of increased permittivity.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, CMOS technology is currently one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of MOS transistors. Thus, as the speed of creating the channel, which depends on, among other things, the conductivity of the gate electrode and the channel resistivity, substantially determines the transistor characteristics, the scaling of the channel length, and associated therewith the reduction of channel resistivity, is a dominant design criterion for accomplishing an increase in the operating speed of the integrated circuits.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material of a gate insulation layer that separates the gate electrode, frequently comprised of polysilicon or metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 µm may require a gate dielectric made of silicon dioxide as thin as approximately 1.2 nm. Although, generally, usage of high speed transistor elements having an extremely short channel may be substantially restricted to high speed signal paths, whereas transistor elements with a longer channel may be used for less critical signal paths, such as storage transistor elements, the relatively high leakage current caused by direct tunneling of charge carriers through an ultra-thin silicon dioxide gate insulation layer may reach values for an oxide thickness in the range of 1-2 nm that may not be compatible with thermal design power requirements for performance driven circuits.

Therefore, replacing silicon dioxide based dielectrics as the material for gate insulation layers has been considered, particularly for extremely thin silicon dioxide based gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. It has thus been suggested to replace silicon dioxide with high permittivity materials such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide based layer, while additionally maintaining leakage currents at an acceptable level. On the other hand, the non-polysilicon material, such as titanium nitride and the like, in combination with other metals, may be formed so as to connect to the high dielectric material, thereby substantially avoiding the presence of a depletion zone. Since the threshold voltage of the transistors, which represents the voltage at which a conductive channel forms in the channel region, is significantly determined by the work function of the metal-containing gate material, an appropriate adjustment of the effective work function with respect to the conductivity type of the transistor under consideration has to be guaranteed.

Providing different metal species for adjusting the work function of the gate electrode structures for P-channel transistors and N-channel transistors at an early manufacturing stage may, however, be associated with a plurality of difficulties, which may stem from the fact that a complex patterning sequence may be required during the formation of the sophisticated high-k metal gate stack, which may result in a significant variability of the resulting work function and thus threshold of the completed transistor structures. For instance, during a corresponding manufacturing sequence, the high-k material may be exposed to oxygen, which may result in an increase of layer thickness and thus a reduction of the capacitive coupling. Moreover, a shift of the work function may be observed when forming appropriate work function metals in an early manufacturing stage, which is believed to be caused by a moderately high oxygen affinity of the metal species, in particular during high temperature processes which may typically be required for completing the transistor structures, for instance for forming drain and source regions and the like.

For this reason, in some approaches, the initial gate electrode stack may be provided with a high degree of compatibility with conventional polysilicon-based process strategies and the actual electrode metal and the final adjustment of the work function of the transistors may be accomplished in a very advanced manufacturing stage, i.e., after completing the basic transistor structure. In a corresponding replacement gate approach, the high-k dielectric material may be formed and may be covered by an appropriate metal-containing material, such as titanium nitride and the like, followed by a standard polysilicon or amorphous silicon material, which may then be patterned on the basis of well-established advanced lithography and etch techniques. Consequently, during the process sequence for patterning the gate electrode structure, the sensitive high-k dielectric material may be protected by the metal-containing material, possibly in combination with sophisticated sidewall spacer structures, thereby substantially avoiding any undue material modification during the further processing. After patterning the gate electrode structure, conventional and well-established process techniques for forming the drain and source regions having the desired complex dopant profile are typically performed. After any high temperature processes, the further processing may be continued, for instance, by forming a metal silicide, if required, followed by the deposition of an interlayer dielectric material, such as silicon nitride in combination with silicon dioxide and the like. In this manufacturing stage, a top surface of the gate electrode structures embedded in the interlayer dielectric material may be exposed, for instance, by etch techniques, chemical mechanical polishing (CMP) and the like. In many cases, the polysilicon material may be removed in both types of gate electrode structure in a common etch process and thereafter an appropriate masking regime may be applied in order to selectively fill in an appropriate metal, which may be accomplished by filling in the first metal species and selectively removing the metal species from one of the gate electrode structures. Thereafter, a further metal material may be deposited, thereby obtaining the desired work function for each type of transistor.

Although in general this approach may provide advantages in view of reducing process-related non-uniformities in the threshold voltages of the transistors since the high-k dielectric material may be reliably encapsulated during the entire process sequence without requiring an adjustment of the work function and thus the threshold voltage at an early manufacturing stage, the complex process sequence for removing the placeholder material and providing appropriate work function materials for the different types of transistors may also result in a significant degree of variability of the transistor characteristics, which may thus result in offsetting at least some of the advantages obtained by the common processing of the gate electrode structures until the basic transistor configuration is completed.

For example, an efficient removal of the polysilicon material may have a significant influence on the overall characteristics of the replacement gate, i.e., on the provision of appropriate work function metals for the N-channel transistor and P-channel transistor and the subsequent deposition of the actual metal-containing electrode material. For this purpose, typically, a dielectric cap layer in the form of a silicon nitride material may be maintained throughout the entire manufacturing process for forming the gate electrode structures and the basic transistor configuration, which may also act as a silicidation mask during the critical process step for forming metal silicide regions in the drain and source areas in order to suppress the formation of a metal silicide in the polysilicon material since any residues of the silicide material may not be efficiently removed, as will be explained with reference to FIGS. 1a-1e.

Figure 1A:
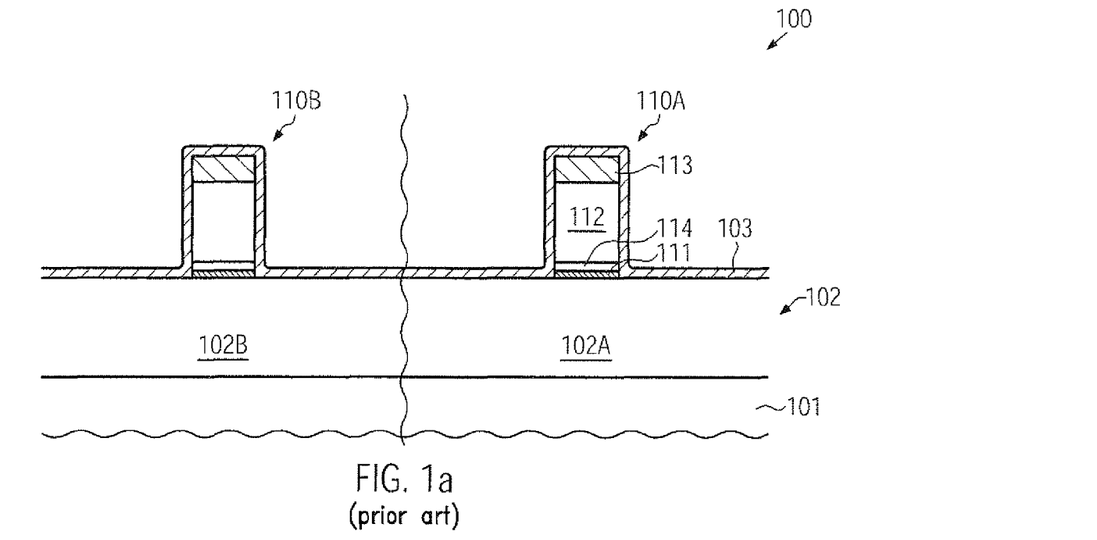
FIGS. 1a-1e schematically illustrate cross-sectional views of a conventional semiconductor device during various manufacturing stages in forming a high-k metal gate electrode on the basis of a replacement gate approach.

FIG. 1a schematically illustrates a cross-sectional view of a semiconductor device 100 in an early manufacturing stage in which a first semiconductor region 102A and a second semiconductor region 102B are formed in a semiconductor layer 102, which in turn is formed above a substrate 101. The substrate 101 typically represents a silicon-based carrier material, above which is formed the semiconductor layer 102, for instance in the form of a silicon-based crystalline material. Moreover, in the manufacturing stage shown, a first gate electrode structure 110A is formed above the first semiconductor region 102A and a second gate electrode structure 110B is formed above the second semiconductor region 102B. Moreover, the regions 102A, 102B and the gate electrode structures 110A, 110B are covered by a spacer layer 103, such as a silicon nitride material. The gate electrode structures 110A, 110B may comprise a sophisticated layer stack, for instance comprising a sophisticated gate dielectric material 111 comprising any high-k dielectric material as specified above, in combination with a titanium nitride cap layer 114. Furthermore, a silicon material 112 is typically formed above the cap layer 114, followed by a dielectric cap layer 113 in the form of a silicon nitride material.

The semiconductor device 100 as illustrated in FIG. 1a may be formed on the basis of the following well-established process techniques. First, the semiconductor regions 102A, 102B may be formed by providing appropriate isolation structures in the semiconductor layer 102, for instance in the form of shallow trench isolations and the like, which, for convenience, are not shown in FIG. 1a. For this purpose, any appropriate process techniques may be applied. Thereafter, the complex gate material stack may be formed by oxidation and deposition techniques using any appropriate process recipes for obtaining the desired materials and the corresponding layer thickness values, such as for the gate dielectric material 111 and the cap layer 114. Thereafter, the silicon material 112 may be deposited on the basis of well-established low pressure chemical vapor deposition (CVD) techniques, followed by the deposition of the silicon nitride cap material 113. Furthermore, if required, any additional materials, such as hard mask materials and anti-reflective coating (ARC) materials, may be formed in accordance with requirements for the subsequent lithography and patterning strategies. Consequently, the gate electrode structures 110A, 110B are obtained with a desired critical length, i.e., in FIG. 1a, the horizontal extension of the material 114, which may be approximately 50 nm and less in sophisticated applications. Thereafter, the spacer layer 103 in the form of a silicon nitride material is deposited by using thermally activated CVD techniques or plasma enhanced deposition recipes so as to obtain a desired layer thickness and material characteristics as required for the further processing. That is, the spacer layer 103 may be used for appropriately covering the sidewalls of the gate electrode structures 110A, 110B and in particular the sidewalls of the sensitive materials 111 and 114 during the further processing. Moreover, the spacer layer 103 may be used for providing sidewall spacers, which may additionally provide a corresponding lateral offset during the incorporation of dopant species for forming drain and source extension regions during the further processing of the device 100. In addition, corresponding sidewall spacer elements may be used as an etch and growth mask for incorporating a strain-inducing semiconductor material, for instance into the semiconductor region 102A, in order to create a desired strain component therein. It is well established that strain in the channel region of a field effect transistor may have a significant influence on the mobility of the charge carriers and may therefore result in a pronounced modification of drive current capability and thus performance of the transistor. For example, the generation of a compressive strain component in the channel region of P-channel transistors formed on the basis of a standard crystallographic configuration of a silicon layer may result in superior performance, which may be accomplished by incorporating a silicon/germanium alloy into the silicon material, which may result in a corresponding strained state, which may thus create a corresponding strain in the adjacent channel region. The incorporation of the silicon/germanium alloy is typically accomplished by forming cavities in the semiconductor region corresponding to the P-channel transistor, for instance the semiconductor region 102A, and subsequently refilling the cavities by using a selective epitaxial growth technique while substantially suppressing a material deposition on the semiconductor region 102B and the corresponding gate electrode structure 110B when representing an N-channel transistor.

Figure 1B:
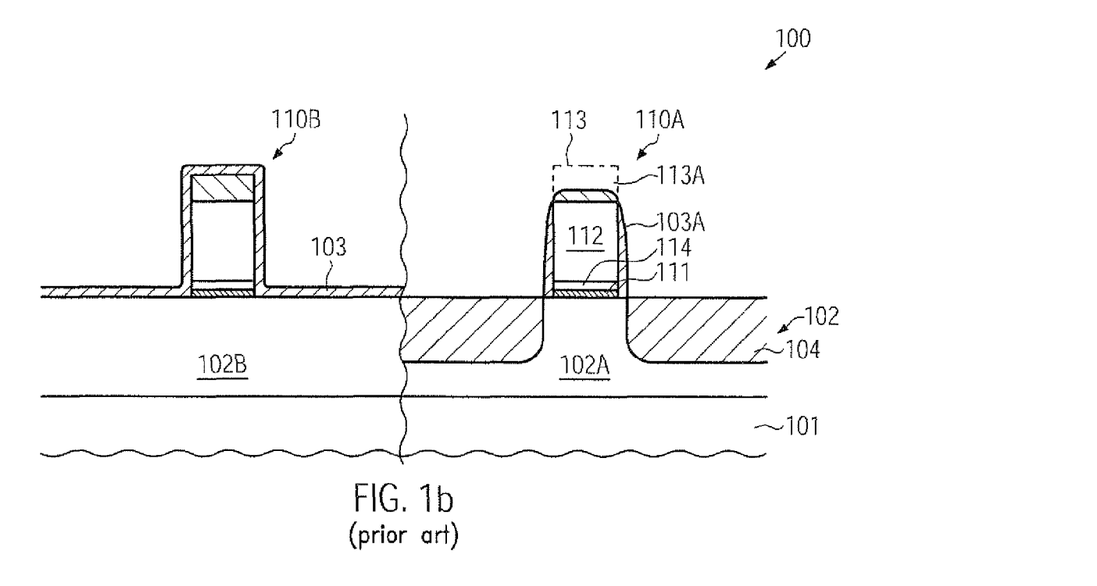

FIG. 1b schematically illustrates the semiconductor device 100 in a further advanced manufacturing stage. As illustrated, a spacer element 103A is formed on sidewalls of the gate electrode structure 110A and may represent a remaining portion of the spacer layer 103, which is substantially completely preserved above the semiconductor region 102B and the gate electrode structure 110B. Moreover, the thickness of the silicon nitride cap layer 113 may be significantly reduced, as indicated by reference sign 113A. Additionally, a silicon/germanium alloy 104 is formed in the semiconductor region 102A with a lateral offset from the gate electrode structure 110A, i.e., from the material 112, that may be based on a thickness of the sidewall spacer 103A.

The semiconductor device 100 as illustrated in FIG. 1b may typically be formed on the basis of the following processes. After providing the spacer layer 103, the region 102B and the gate electrode structure 110B are masked, for instance by a resist material, and the exposed portion of the spacer layer 103 is etched so as to form the spacer elements 103A, which may be accomplished on the basis of any well-established anisotropic etch recipe. Thereafter, an appropriate etch chemistry is selected in order to etch into the semiconductor region 102A, thereby forming corresponding cavities, the offset of which may be defined on the basis of the spacer elements 103A and the characteristics of the corresponding etch recipe. It should be appreciated that during the etch process a certain amount of the silicon nitride cap layer 113 may also be removed. Thereafter, the remaining resist material is removed and the device 100 is treated on the basis of appropriate cleaning recipes using wet chemical chemistries in order to prepare exposed surface portions for the subsequent selective epitaxial deposition of the silicon/germanium alloy. Thereafter, the silicon/germanium alloy 104 is deposited by applying well-established deposition recipes in order to refill and, if desired, overfill the previously formed cavities. During the selective epitaxial growth process, the silicon nitride cap layer 113A in combination with the spacer element 103A acts as a growth mask, while the region 102B and the gate electrode structure 110B are still reliably covered by the spacer layer 103. As explained above, the spacer element 103A may also act as an offset spacer during a subsequent implantation process and consequently a corresponding spacer element is also to be formed on sidewalls of the gate electrode structure 110B. Consequently, the semiconductor region 102A and the gate electrode structure 110A are masked by resist material while the spacer layer 103 is exposed to an anisotropic etch ambient in order to form corresponding spacer elements, as is also described above for the spacer element 103A.

Figure 1C:
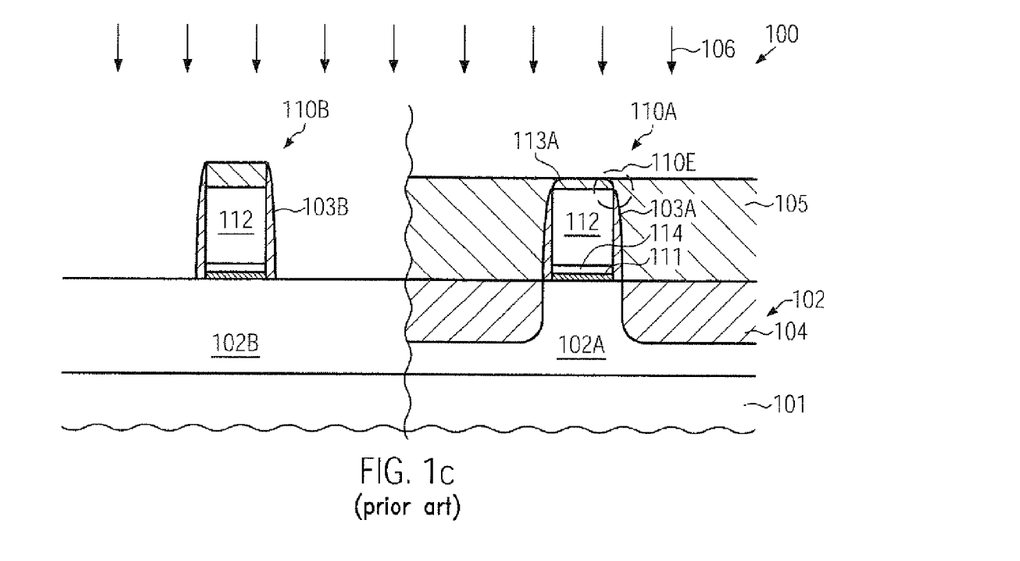

FIG. 1c schematically illustrates the semiconductor device 100 during a corresponding anisotropic etch process 106 in a phase in which spacer elements 103B are formed on the gate electrode structure 110B. On the other hand, a resist mask 105 covers the semiconductor region 102A. As previously explained, the dielectric cap layer 113A may have experienced a different process flow, for instance a different number of aggressive process environments in the form of wet chemical cleaning processes and the like, which may also result in a certain degree of material erosion in addition to the material erosion caused during the formation of the spacer element 103A. Consequently, a significant difference in thickness between the dielectric cap layer 113 of the gate electrode structure 110B and the silicon nitride cap layer 113A may still exist which, however, may negatively influence the further processing of the semiconductor device 100. For this reason, in sophisticated conventional approaches, the etch process 106 may be performed on the basis of a predetermined over-etch time in order to further reduce the thickness of the cap layer 113 of the gate electrode structure 110B, thereby attempting to obtain an adaptation of the thickness of the layers 113 and 113A. However, during the corresponding over-etch phase, increasingly, material of the resist mask 105 may be removed, thereby also exposing the silicon nitride cap layer 113A. Hence, a further reduction in thickness may occur which may result in an exposure of the material 112 after the etch process 106 or during the further processing of the device 100. For example, at upper edge regions 110E, a high risk of reducing integrity of the encapsulation of the material 112 may be caused if an efficient adaptation of the thickness of the materials 113 and 113A is to be achieved. On the other hand, reducing the overall over-etch time may result in a significant difference in height of the gate electrode structures 110B, 110A during the further processing.

Figure 1D:
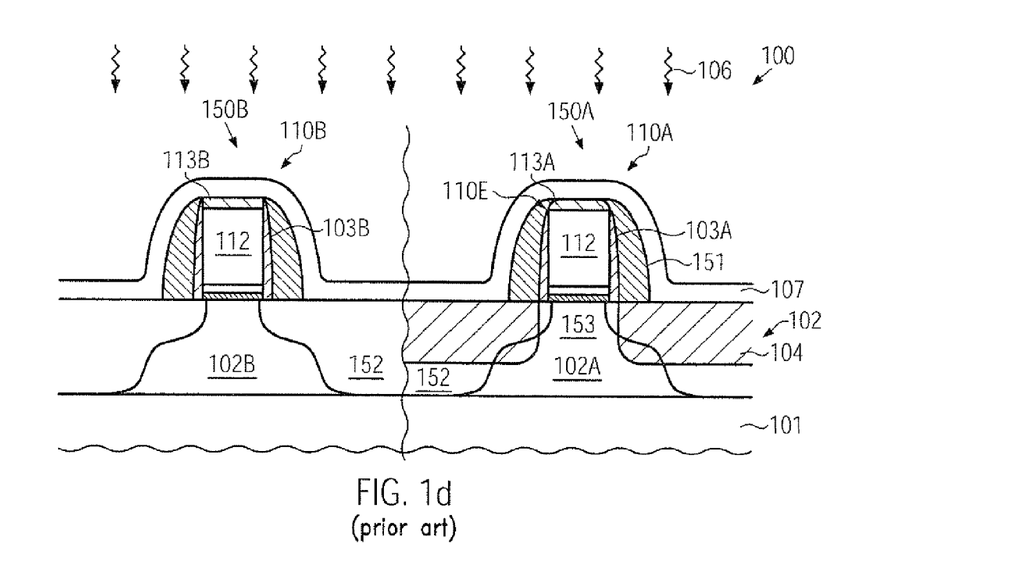

FIG. 1d schematically illustrates the semiconductor device 100 in a further advanced manufacturing stage in which the basic configuration of a P-channel transistor 150A is provided in and above the semiconductor region 102A and the basic configuration of an N-channel transistor 150B is provided in and above the semiconductor region 102B. As illustrated, the transistors 150A, 150B comprise drain and source regions 152, the dopant profile of which has been established on the basis of the spacers 103A, 103B and an additional spacer structure 151 in accordance with well-established process strategies. Furthermore, in the transistor 150A, the strain-inducing silicon/germanium alloy 104 may induce a desired compressive strain component in a channel region 153. Moreover, a metal layer 107, such as a nickel material, a platinum material, or any other appropriate refractory metal or a combination of refractory metals, is formed above the regions 102A, 102B and the gate electrode structures 110A, 110B. Hence, the dielectric cap layer 113A and a corresponding cap layer 113B substantially matched in thickness to each other represent a dielectric buffer material between the polysilicon material 112 and the metal layer 107.

The transistors 150A, 150B may be formed by applying any appropriate process techniques, for instance implanting appropriate dopant species into the regions 102A, 102B by using the spacers 103A, 103B and the spacer structure 151 as appropriate implantation masks. After a corresponding anneal process, in combination with respective cleaning processes, the metal layer 107 is deposited by using any well-established process recipe. As previously discussed, during the entire process sequence, the reduced degree of integrity of the material 112 in the upper edge region 110E may additionally contribute to an undesired exposure of the material 112, which may result in an undesired formation of a certain amount of metal silicide in the gate electrode structure 110A when performing a heat treatment in order to initiate a chemical reaction between the silicon species of the semiconductor materials in the regions 152 and the metal species in the layer 107.

Figure 1E:
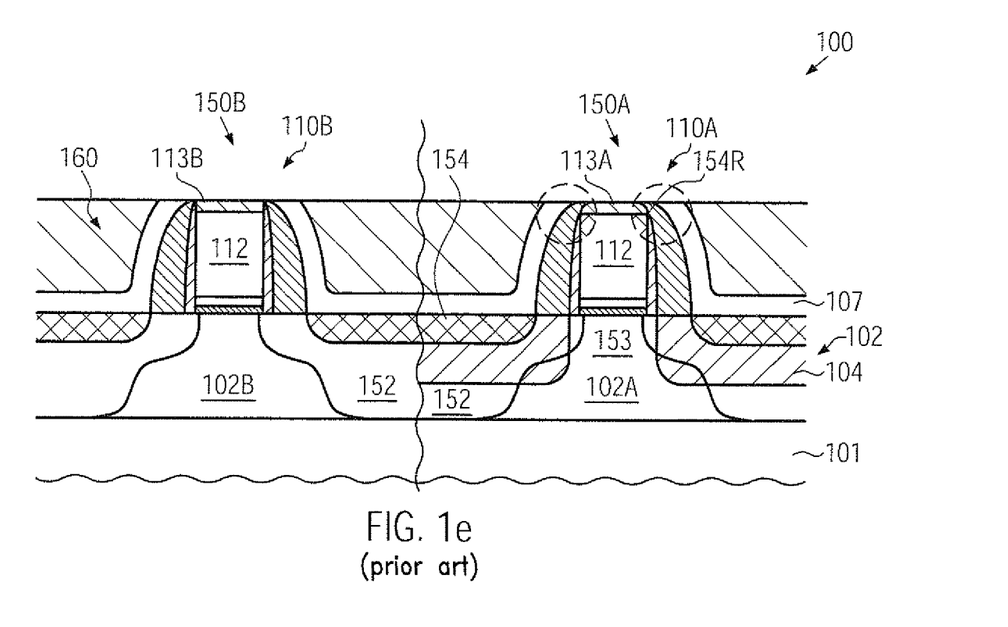

FIG. 1*e* schematically illustrates the semiconductor device 100 in a further advanced manufacturing stage in which metal silicide regions 154 are formed in the drain and source regions 152 and a portion of an interlayer dielectric material 160, for instance in the form of a silicon nitride material in combination with a silicon dioxide material, is provided in order to laterally enclose the gate electrode structures 110A, 110B. As discussed above, due to the inferior integrity of the cap layer 113A, a certain amount of metal silicide 154R may have formed in the gate electrode structure 110A, which may have a significant negative influence during the further processing. That is, in the replacement gate approach, as discussed above, the cap layers 113A, 113B are removed, for instance by CMP, in order to expose the material 112, which is subsequently removed on the basis of highly selective wet chemical etch recipes, such as TMAH (tetramethyl ammonium hydroxide), wherein, however, these efficient etch recipes may not efficiently etch metal silicide, thereby resulting in a non-removed polysilicon material. Consequently transistor failure, or at least a significant variation of transistor characteristics, may be induced during the further processing in replacing the material 112 with an appropriate work function metal and a metal-containing electrode material.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques for forming gate electrode structures on the basis of a dielectric cap material, the integrity of which, in combination with the integrity of sidewall spacer elements, may be enhanced in a process sequence in which the spacer elements may be formed at different process stages for N-channel transistors and P-channel transistors. For this purpose, a hard mask material having superior etch resistivity compared to resist materials may be provided after patterning the gate electrode structures and forming offset spacer elements on gate electrode structures on one type of transistor and prior to patterning the remaining spacer material for forming spacer elements on sidewalls of the gate electrode structure of the other type of transistor. In this manner, an efficient adaptation of layer thickness of cap materials having experienced different process histories may be accomplished without contributing to a reduced degree of integrity of the previously reduced dielectric cap material due to the presence of the mask material having the superior etch resistivity. Consequently, the further processing may be continued on the basis of well-matched gate height for any type of transistor, while at the same time the probability of creating undue metal silicide areas in a placeholder material of the gate electrode structures may be significantly reduced. Thus, in some illustrative embodiments, a replacement gate approach may be efficiently applied on the basis of a reduced degree of transistor failures or transistor variability due to an efficient and uniform removal of the placeholder material, such as a silicon material, on the basis of well-established etch recipes. In some illustrative aspects disclosed herein, in addition to efficiently masking the gate electrode structure and thus the reduced dielectric cap material of one type of transistor, a sacrificial spacer element may be provided for the gate electrode structure masked by the spacer material, which may then be patterned into the desired offset spacer elements in the presence of the sacrificial spacer elements, thereby achieving a well-defined spacer width substantially without being affected by the etch process. Consequently, the degree of material removal of the dielectric cap layer may be substantially "decoupled" from the finally obtained thickness of the offset spacer element, which is thus substantially defined by the initial layer thickness of the spacer material.

One illustrative method disclosed herein comprises forming a first gate electrode structure above a first semiconductor region of a semiconductor device and a second gate electrode structure formed above a second semiconductor region, wherein the first and second gate electrode structures comprise a gate insulation layer including a high-k dielectric material, a placeholder material and a dielectric cap layer formed above the placeholder material. The method further comprises forming a spacer layer above the first and second semiconductor regions and the first and second gate electrode structures and forming a first offset spacer element selectively on the first gate electrode structure from the spacer layer. The method further comprises forming a strain-inducing semiconductor alloy selectively in the first semiconductor region by using the first spacer element to adjust a lateral offset of the strain-inducing semiconductor alloy from the first gate electrode structure. The method additionally comprises forming a hard mask to cover at least the first semiconductor region and the first gate electrode structure and to expose at least a portion of the spacer layer formed above the second semiconductor region. Additionally, the method comprises forming a second offset spacer element from the spacer layer on the second gate electrode structure by using the hard mask as an etch mask.

A further illustrative method disclosed herein comprises forming a mask layer above a first gate electrode structure and a second gate electrode structure of a semiconductor device, wherein the second gate electrode structure is covered by a spacer layer and the first gate electrode structure comprises a first offset spacer element formed from the spacer layer. The method further comprises selectively removing the mask layer from the second gate electrode structure so as to form a hard mask that covers the first gate electrode structure. The method additionally comprises forming a second offset spacer element on the second gate electrode structure by using the hard mask as an etch mask. Additionally, the method comprises adjusting a thickness of a sacrificial dielectric cap layer provided in the second gate electrode structure to a thickness of a sacrificial dielectric cap layer provided in the first gate electrode structure by performing an etch process in the presence of the hard mask. Finally, the method comprises continuing a process sequence to form a first transistor and a second transistor on the basis of the first and second gate electrode structures that comprise the sacrificial dielectric cap layers having the adjusted thickness.

A still further illustrative method disclosed herein comprises forming a mask layer above a first electrode structure and a second gate electrode structure of a semiconductor device, wherein the second gate electrode structure is covered by a spacer layer and the first gate electrode structure comprises a first offset spacer element formed from the spacer layer. Moreover, a mask is formed above the first gate electrode structure and an anisotropic etch process is performed in order to form a sacrificial spacer element from the mask layer that is formed on the second gate electrode structure. The method further comprises forming a second offset spacer element on the second gate electrode structure by using the sacrificial spacer element and the mask layer formed above the first gate electrode structure as an etch mask. Additionally, the method comprises adjusting a thickness of a sacrificial dielectric cap layer provided in the second gate electrode structure to a thickness of a sacrificial dielectric cap layer provided in the first gate electrode structure by performing an etch process in the presence of a hard mask and the sacrificial spacer element. Additionally, the method comprises continuing a process sequence to form a first transistor and a second transistor on the basis of the first and second gate electrode structures that comprise the sacrificial dielectric cap layers having the adjusted thickness.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides techniques for forming sophisticated gate electrode structures which may experience a different process history, for instance when incorporating a strain-inducing semiconductor material in one type of transistor element. The different degree of exposure to aggressive process environments may be compensated for by appropriately adjusting the thickness of a dielectric cap material on the basis of an etch process, while a dielectric cap material previously reduced in thickness may be reliably protected by a hard mask material, which may provide a significantly increased degree of etch resistivity compared to resist materials and the like. Consequently, the further processing may be continued on the basis of appropriately adjusted gate heights of the different types of transistors, irrespective of the different process history of the gate electrode structures, wherein a reliable and uniform removal of the placeholder material, for instance a silicon-based material, may be accomplished after completing the basic transistor configuration by using well-established and efficient etch recipes, since the generation of any metal silicide in the placeholder material may be efficiently suppressed. In some illustrative embodiments disclosed herein, the process of adjusting the thickness of the dielectric cap material of one type of gate electrode structure may be performed substantially without affecting the resulting thickness of the offset spacer element by first forming a sacrificial spacer element, for instance on the basis of the mask material that may also be used for covering the other type of gate electrode structure. As a consequence, in addition to providing superior flexibility in adjusting the desired gate height for the further processing, superior uniformity with respect to a desired lateral offset, for instance in view of ion implantation and the like, may also be accomplished due to the provision of the sacrificial spacer element. Consequently, in some illustrative embodiments, the work function of sophisticated gate electrode structures may be adjusted in a very advanced manufacturing stage with a high degree of uniformity due to the efficient removal of the placeholder material, thereby contributing to superior transistor characteristics since the advantages of a reduced threshold variability per se inherent to the replacement gate approach may not be compromised by irregularities during the replacement of the placeholder material.

With reference to FIGS. 2a-2i, further illustrative embodiments will now be described in more detail, wherein reference may also be made to FIGS. 1a-1e, if appropriate.

Figure 2A:
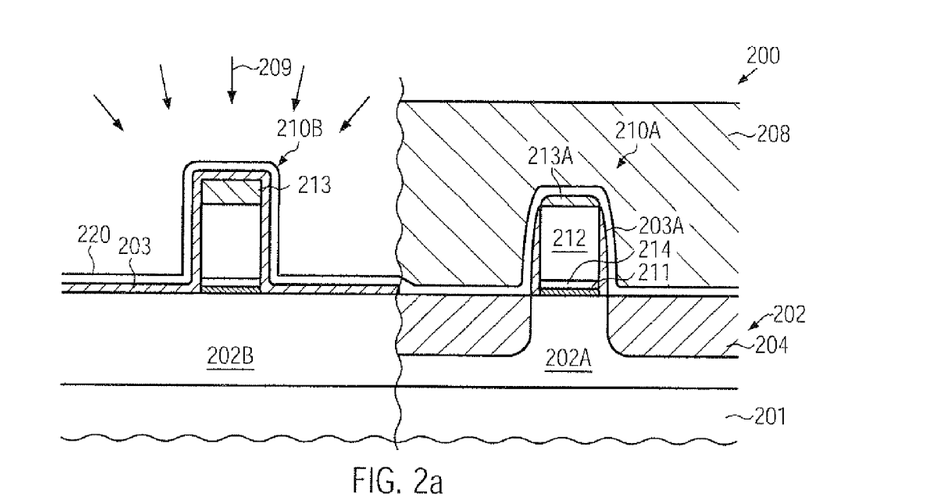
FIGS. 2a-2c schematically illustrate cross-sectional views of a semiconductor device during various manufacturing stages in forming offset spacer elements at different process stages by using a hard mask material for enhancing adaptation of the thickness of dielectric cap materials and reducing the probability of reducing integrity of the dielectric cap material, according to illustrative embodiments.

FIG. 2a schematically illustrates a cross-sectional view of a semiconductor device 200 comprising a substrate 201 above which may be formed a semiconductor layer 202. The substrate 201 may represent any appropriate carrier material for forming thereabove the semiconductor layer 202, which may be provided in the form of a silicon layer, a silicon/germanium layer or any other appropriate semiconductor material for forming therein and thereabove transistor elements. It should be appreciated that, at least locally, the semiconductor device 200 may comprise a buried insulating layer (not shown) positioned between the substrate 201 and the semiconductor layer 202 in order to present a silicon-on-insulator (SOI) configuration. In the manufacturing stage shown, the semiconductor layer 202 may comprise a first semiconductor region 202A, which may represent an "active" region in and above which one or more transistor elements are to be formed. Furthermore, a second semiconductor region 202B may be provided in the semiconductor layer 202, which may typically be accomplished by forming appropriate isolation structures (not shown). In one illustrative embodiment, the semiconductor region 202A may represent the region for forming a P-channel transistor while the semiconductor region 202B may represent the active region of an N-channel transistor. In other cases, the region 202A may represent the active region of an N-channel transistor if performance thereof may be enhanced by incorporating an appropriate semiconductor material. For example, as shown in FIG. 2a, a strain-inducing semiconductor alloy 204 may be provided in the region 202A, for instance as a compressive strain-inducing material of a P-channel transistor, while a tensile strain-inducing material may be used in the case of an N-channel transistor. It should further be appreciated that the type and magnitude of strain to be induced by the semiconductor material 204 may depend on the overall crystalline configuration of the semiconductor layer 202 or, if a corresponding crystalline configuration may vary in a highly local manner, the material 204 may be selected on the basis of the crystalline configuration within the individual semiconductor regions 202A, 202B. For example, the material 204 may represent a silicon/germanium alloy with an appropriate germanium concentration in order to obtain a desired strain component.

Furthermore, gate electrode structures 210A, 210B are formed above the regions 202A, 202B and may comprise a gate dielectric material 211, above which may be provided a placeholder material 212, for instance in the form of a silicon-containing material. In some illustrative embodiments, the gate dielectric material 211 may comprise a high-k dielectric material, such as hafnium-containing materials, zirconium-containing materials and the like. Generally, a dielectric material having a dielectric constant of approximately 10.0 and higher may be considered as a high-k dielectric material in this application. Moreover, in some illustrative embodiments, the gate dielectric material 211 may be covered by cap material 214, such as a conductive titanium nitride material, an aluminum-based material and the like. Moreover, the gate electrode structure 210A may comprise a dielectric cap layer 213A, such as a silicon nitride material and the like. Similarly, the gate electrode structure 210B may comprise a dielectric cap layer 213, wherein the layers 213 and 213A may have a different size and shape due to the different process history experienced by the gate electrodes 210A, 210B, as is also previously explained. Moreover, an offset spacer element 203A may be formed on sidewalls of the gate electrode structure 210A, while the gate electrode structure 210B and the region 202B may be covered by a spacer layer 203. The spacer element 203A and the spacer layer 203 may be comprised of any appropriate dielectric material that may provide the desired material characteristics in view of integrity of the sensitive materials 211 and 214, the etch resistivity during the further processing and the like. For example, silicon nitride material may be provided with superior material characteristics in view of density and the like, so that a thickness or width of the layer 203 and the spacer elements 203A of approximately one to several nanometers may be appropriate for the further processing of the device 200.

Additionally, the semiconductor device 200 may further comprise a mask layer 220 that is formed above the first and second semiconductor regions 20Aa, 202B and which also covers the gate electrode structures 210A, 210B. The mask layer 220 may be referred to as a hard mask material in the sense that it may provide superior etch resistivity and mechanical strength even at moderately high temperatures, for instance compared to resist materials, a plurality of polymer materials and the like. For example, the mask layer 220 may be comprised of silicon and oxygen, possibly in combination with small amounts of other species such as hydrogen and the like, as may typically be incorporated upon depositing a silicon oxide based material. In other cases, the mask layer 220 may be comprised of any other material providing a pronounced etch selectivity with respect to the spacer layer 203 when exposed to an etch ambient in a later manufacturing stage. For example, a plurality of materials may provide a moderately pronounced etch selectivity, such as hafnium oxide and the like, even when provided with a relatively small layer thickness. For example, if provided in the form of a silicon oxide based material or a hafnium oxide based material, the mask layer 220 may have a layer thickness of approximately 10 nm and less, such as 8 nm and less. Additionally, the semiconductor device 200 may comprise an etch mask 208, such as a resist mask, in order to expose the mask layer 220 above the second semiconductor region 202B while protecting the mask layer 220 above the first semiconductor region 202A.

The semiconductor device 200 may be formed on the basis of the following processes. The semiconductor regions 202A, 202B and the gate electrode structures 210A, 210B may be formed on the basis of any well-established process technique, as is also basically described with reference to the semiconductor device 100. After the patterning of the gate electrode structures 210A, 210B, the spacer layer 203 may be deposited, for instance, by thermally activated CVD and/or plasma enhanced CVD techniques, followed by a patterning sequence for forming the spacer element 203A while preserving the spacer layer 203 above the semi-conductor region 202B. Next, a corresponding sequence of processes may be performed to incorporate the strain-inducing material 204, which may result in a significant degree of material erosion of the cap material formed above the placeholder material 212, thereby obtaining the dielectric cap layer 213A, as is also previously explained. Next, the mask layer 220 may be formed, for instance, by using well-established deposition techniques, such as plasma enhanced CVD or thermally activated CVD for forming a silicon oxide based material with the desired thickness. Using a silicon oxide based material may be advantageous due to a plurality of well-established deposition and etch recipes, which may be used during the further processing in appropriately adjusting the thickness of the cap layer 213 without compromising integrity of the cap layer 213A. In other cases, any other appropriate materials, such as hafnium oxide and the like, may be used which may be advantageous when a corresponding high-k dielectric material may also be applied when forming the gate dielectric material 211, since corresponding resources in terms of equipment and raw materials may be readily available in a corresponding semiconductor facility. Next, the etch mask 208 may be formed, for instance, by well-established lithography techniques, and the device 200 may be exposed to an etch ambient 209 in order to remove the exposed portion of the mask layer 220. In one illustrative embodiment, the etch process 209 may be performed as a wet chemical etch process, for instance on the basis of hydrofluoric acid (HF), in order to efficiently remove silicon oxide based materials selectively with respect to the spacer layer 203 and the resist mask 208. In other cases, any other appropriate wet chemical etch recipes may be used in order to efficiently remove the mask layer 220, for example by applying cleaning recipes which may frequently be applied during the entire sequence of forming semiconductor materials. In other cases, the etch process 209 may be performed on the basis of an isotropic plasma assisted etch process in order to substantially completely remove the exposed portion of the mask layer 220.

Figure 2B:
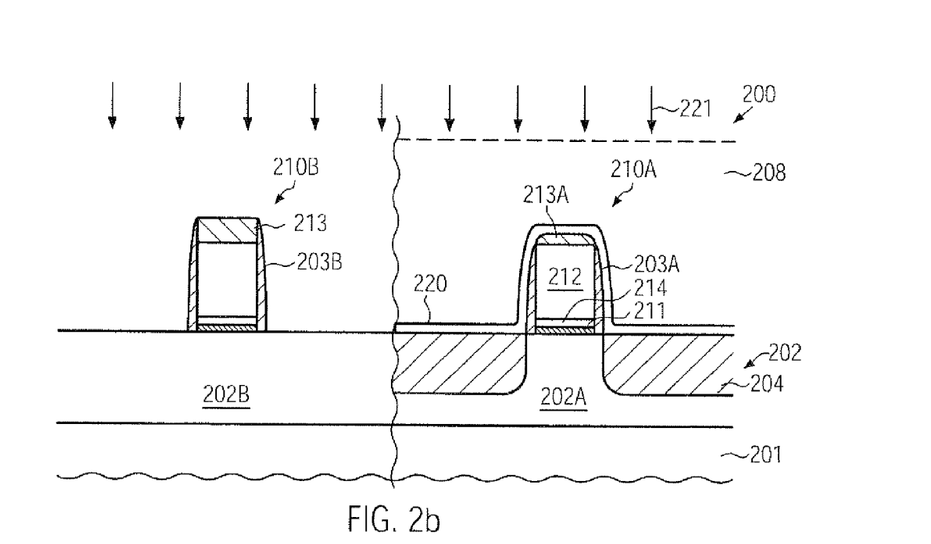

FIG. 2b schematically illustrates the semiconductor device 200 in a further advanced manufacturing stage. As illustrated, the device 200 may be exposed to a further etch ambient 221 which may be established in the form of a plasma assisted etch process having a highly anisotropic etch characteristic. For this purpose, a plurality of well-established fluorine or chlorine based etch chemistries may be used, which may have a pronounced etch selectivity with respect to silicon oxide based materials and silicon-based materials. For example, etching silicon nitride material selectively with respect to silicon oxide material and silicon material is a frequently used and well-established process strategy. It should be appreciated that the etch ambient 221 may be established after removing the resist mask 208, thereby avoiding exposure of the cap layer 213 to a corresponding reactive process ambient required for removing the resist mask 208. In other cases, the mask 208 may also be present during the anisotropic etch process 221, wherein a corresponding material erosion may not negatively influence integrity of the layer 213A of the gate electrode 210A due to the presence of the mask material 220. Consequently, the etch process 221 may be appropriately controlled so as to also adjust a thickness of the cap layer 213 with respect to a thickness of the layer 213A. That is, during a corresponding over-etch period in which the cap layer 213 may be exposed to the process ambient of the etch process 221, the gate electrode structure 210A may be reliably protected by the mask material 220. It should be appreciated that, if considered appropriate, the adjustment of the final thickness of the layer 213 may be achieved by applying a separate etch step, for instance by using a different etch chemistry and the like.

Figure 2C:
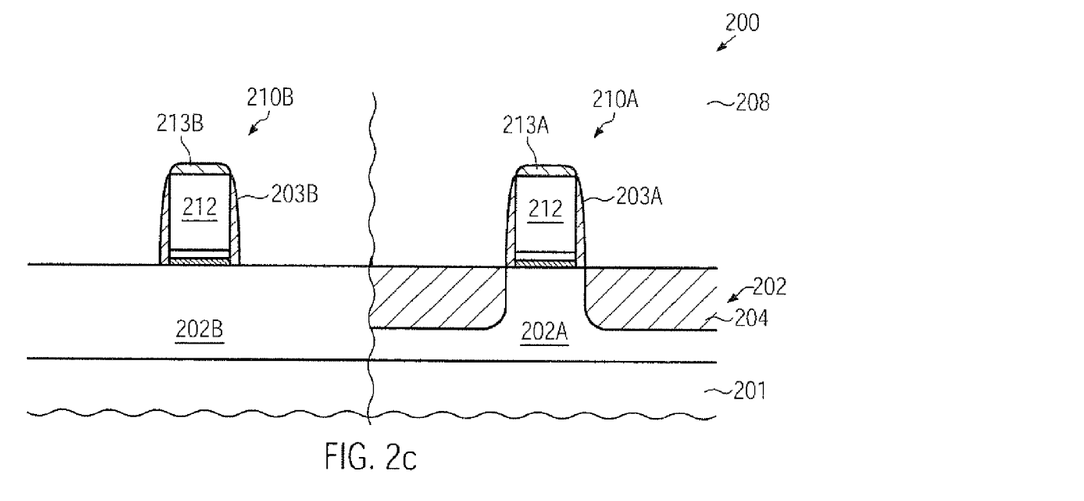

FIG. 2c schematically illustrates the semiconductor device 200 in a further advanced manufacturing stage. As shown, the gate electrode structure 210B may comprise a cap layer 213B obtained from the etch process of FIG. 2b such that a thickness thereof may be adjusted in view of the thickness of the cap layer 213A, thereby providing more uniform process conditions during the further processing due to a substantially equal gate height without compromising integrity of the cap material 213A.

Consequently, the further processing may be continued by applying any appropriate manufacturing techniques in order to complete the basic transistor configuration and to replace the placeholder materials 212, as is also explained with reference to the semiconductor device 100 and as will be explained later on in more detail.

Figure 2D:
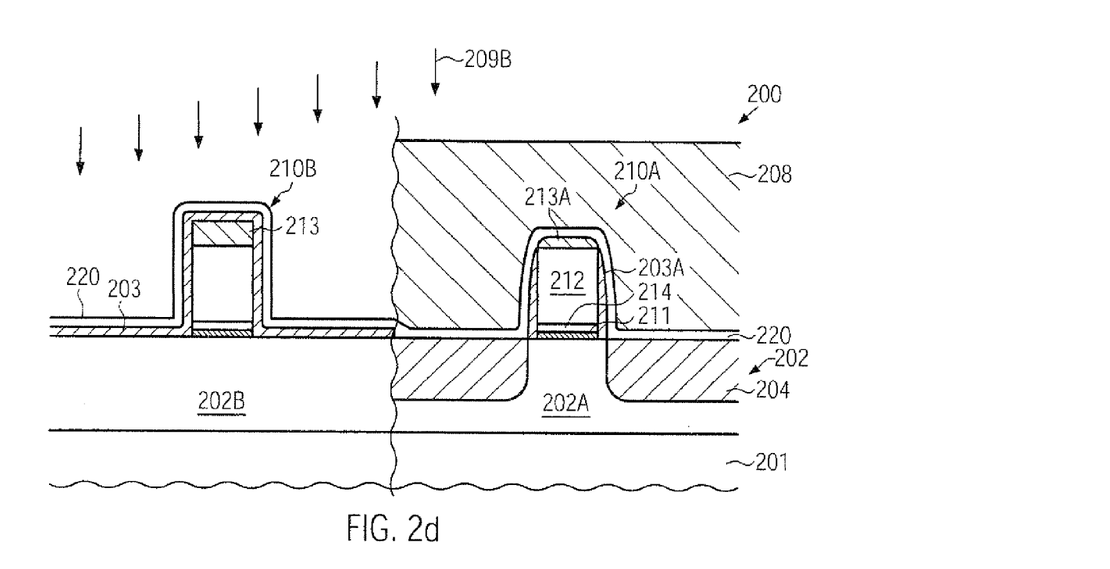
FIGS. 2d-2g schematically illustrate cross-sectional views of the semiconductor device according to still further illustrative embodiments in which offset spacer elements on one type of gate electrode structure may be formed on the basis of a sacrificial spacer material and on the basis of a hard mask material covering the other type of gate electrode structures.

FIG. 2d schematically illustrates the semiconductor device 200 according to other illustrative embodiments in which the device 200 may have substantially the same configuration as illustrated in FIG. 2a, that is, the mask layer 220 may cover the gate electrode structures 210A, 210B and the etch mask 208 may expose the mask layer 220 above the second semiconductor region 202B. Moreover, the semiconductor device 200 may be exposed to an etch ambient 209B, which may be established on the basis of an anisotropic etch recipe in order to etch the mask layer 220 selectively with respect to the spacer layer 203. In other cases, the etch chemistry of the process 209B may be selected so as to have a high selectivity with respect to the material of the semiconductor region 202B, such as a silicon material, a silicon/germanium material and the like, while the selectivity between the materials of the layers 220 and 203 may be less pronounced. For example, for a material system on the basis of silicon oxide and silicon nitride, a plurality of corresponding etch recipes are available or may be readily determined by performing corresponding experiments. Also in this case, since the mask layer 220 is very thin, the etch mask 208 may reliably protect the mask layer 220 above the semiconductor region 202A so as to not compromise the protective effect of the layer 220 during the further processing.

Figure 2E:
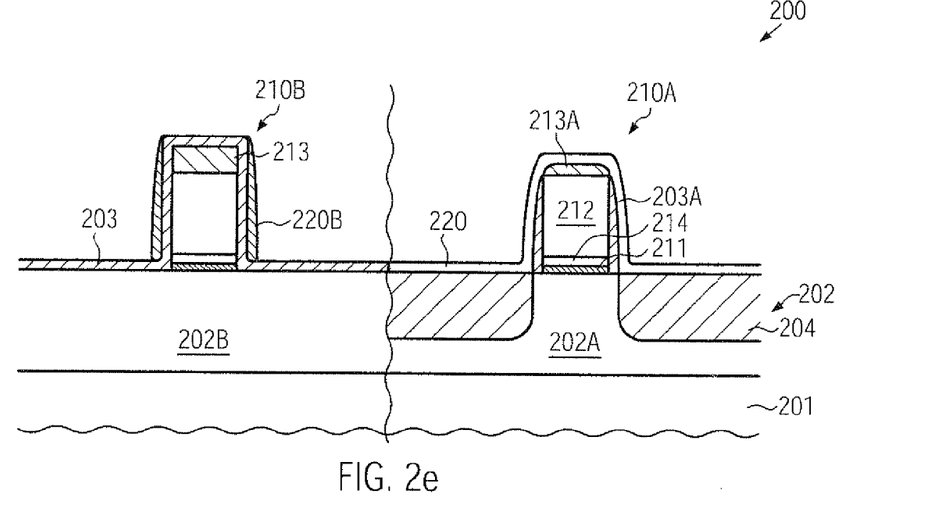

FIG. 2e schematically illustrates the semiconductor device 200 after the etch process 209B of FIG. 2d wherein a spacer element 220B, which may also be referred to as a sacrificial spacer, may be formed on the spacer layer 203 which may still be present at least on sidewalls of the gate electrode structure 210B if a moderately pronounced selectivity between the layers 220 and 203 may have been used. In other cases, a more or less pronounced material erosion of exposed portions of the spacer layer 203 may have occurred during the etch process 209B (FIG. 2d). Furthermore, the etch mask 208 of FIG. 2d may have been removed and appropriate cleaning recipes may have been used, if required. During the corresponding process sequence, the gate electrode structure 210A may be protected by the mask layer 220, thereby also maintaining integrity of the cap layer 213A.

Figure 2F:
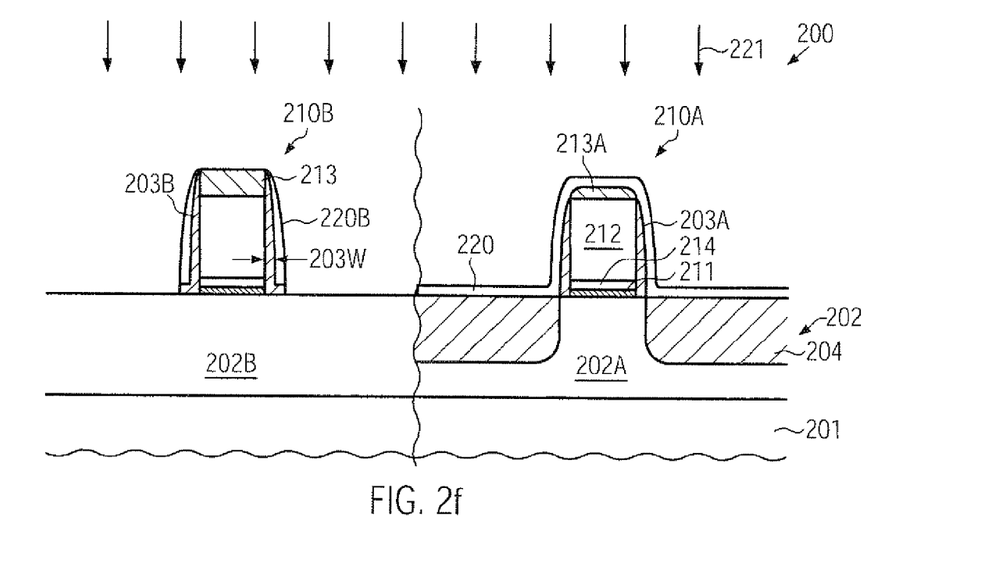

FIG. 2f schematically illustrates the semiconductor device 200 during the etch process 221, which may be performed in the presence of the mask layer 220 and the sacrificial spacer element 220B. Consequently, during the etch process 221, unwanted portions of the spacer layer 203 may be removed, thereby exposing the cap layer 213 while also adjusting a desired thickness thereof, as discussed above. Thus, during exposure to the etch ambient 221, the sacrificial spacer element 220B may efficiently protect the corresponding offset spacers 203B, which may thus attain a width 203W that is substantially determined by the layer thickness of the initially deposited spacer layer 203 (FIG. 2a). Consequently, superior uniformity during the further processing of the gate electrode structure 210B may be accomplished due to the well-defined thickness 203W, irrespective of the degree of material erosion required in the cap layer 213 so as to appropriately adjust the thickness thereof. On the other hand, the gate electrode structure 210A may be reliably protected by the mask layer 220, as discussed above.

Figure 2G:
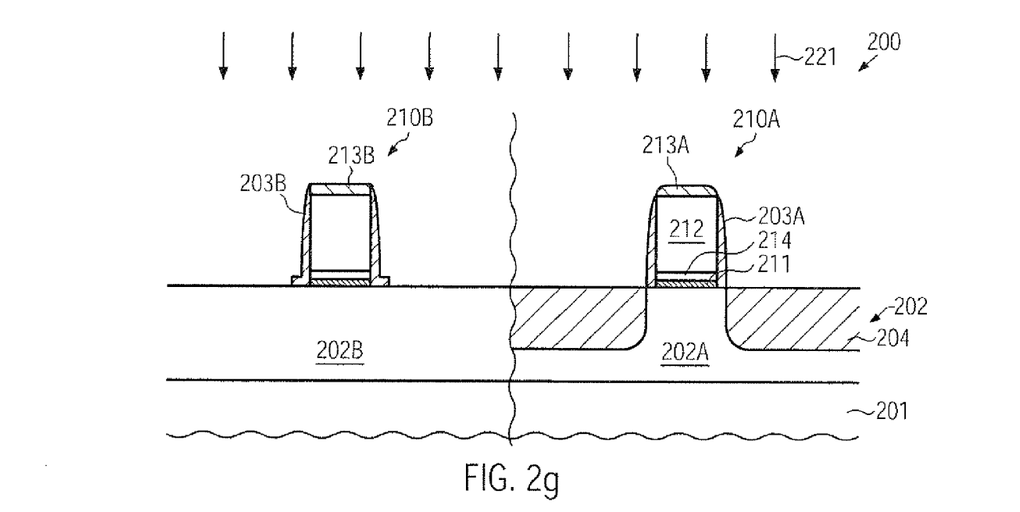

FIG. 2g schematically illustrates the semiconductor device 200 in a further advanced manufacturing stage in which the cap layer 213B may have a thickness that substantially matches the thickness of the layer 213A, thereby providing a substantially uniform gate height during the further processing. Moreover, the sacrificial spacer element 220B (FIG. 2f) may have been removed, for instance, by supplying any appropriate selective etch recipe, such as hydrofluoric acid and the like, when removing a silicon oxide based material. During the corresponding process, the mask layer 220 (FIG. 2f) may also be efficiently removed from above the region 202A.

Figure 2H:
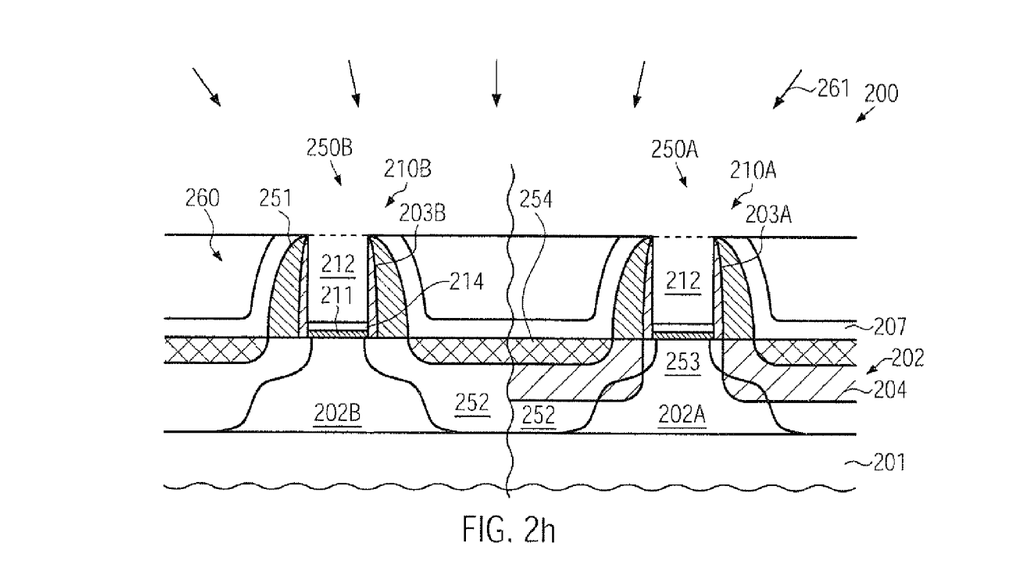
FIGS. 2h-2i schematically illustrate cross-sectional views of the semiconductor device in further advanced manufacturing stages in which a placeholder material may be replaced with superior uniformity due to the enhanced integrity of the dielectric cap materials, according to further illustrative embodiments.

FIG. 2h schematically illustrates the semiconductor device 200 in a further advanced manufacturing stage. The device 200 may comprise a first transistor 250A, such as a P-channel transistor when the material 204 may induce a compressive strain component, while in other cases the transistor 250A may represent an N-channel transistor when the material 204 may create a tensile strain component. Moreover, a second transistor 250B of different conductivity type may be formed in and above the semiconductor region 202B. The transistors 250A, 250B may comprise corresponding drain and source regions 252 with an appropriate configuration corresponding to the respective conductivity type. Similarly, channel regions 253 may have any appropriate configuration in view of dopant concentration and the like, as required by the basic transistor characteristics of the devices 250A, 250B. Furthermore, metal silicide regions 254 may be formed in the drain and source regions 252. The gate electrode structures 210A, 210B may be laterally embedded in an interlayer dielectric material 260, which may comprise silicon nitride in combination with silicon dioxide and the like. If required, the interlayer dielectric material 260 may at least partially have a high internal stress level, which may locally vary in order to further enhance performance of one or both of the transistors 250A, 250B. Moreover, a spacer structure 251 may be formed on sidewalls of the gate electrode structures 210A, 210B, i.e., on the offset spacer elements 203A, 203B. Moreover, the device 200 may be exposed to an etch ambient 261, which may be appropriately selected so as to etch the material 212 selectively with respect to the spacers 203A, 203B and the gate dielectric material 211 or the cap material 214.

During the manufacturing sequence for forming the transistors 250A, 250B, the sensitive materials 211, 214 may be efficiently protected by the spacers 203A, 203B, while at the same time, due to the superior integrity of the cap material 213A in combination with the spacer 203A (FIG. 2g), integrity of the placeholder material 212 may also be preserved with increased efficiency, in particular during a corresponding silicidation process for forming the metal silicide regions 254, as is also previously explained with reference to the semiconductor device 100. Consequently the etch process 261, using any appropriate etch chemistry, such as TMAH, potassium hydroxide and the like, may be performed with superior uniformity since the material 212 may be substantially completely removed, thereby providing superior process conditions for appropriately adjusting the work function of the gate electrode structures 210A, 210B, for instance by depositing an appropriate metal species and performing respective heat treatments. Thus, after the etch process 261, the work function and thus the threshold voltage of the transistors 250A, 250B may be adjusted with superior uniformity on the basis of any appropriate process strategy.

Figure 2I:
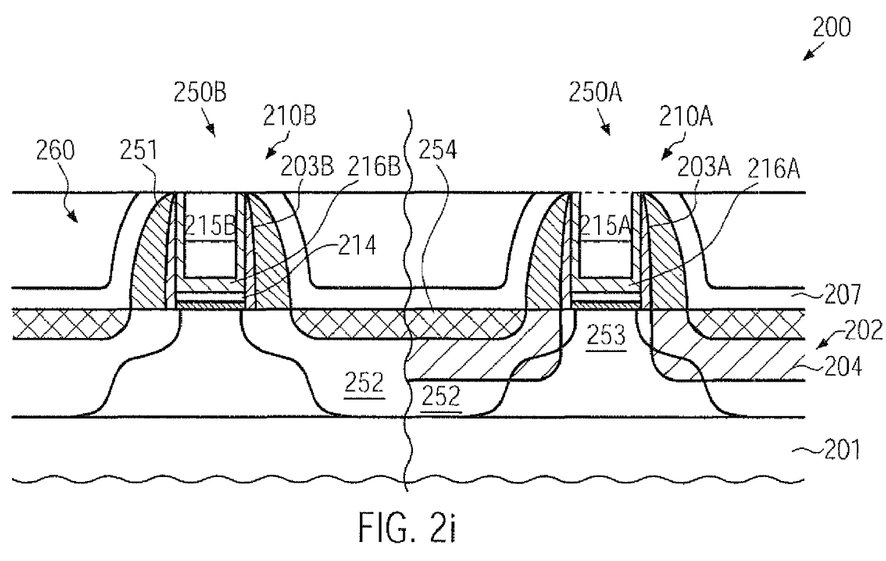

FIG. 2i schematically illustrates the semiconductor device 200 in a further advanced manufacturing stage in which the gate electrode structure 210A may comprise a work function adjusting species 216A in combination with an appropriate metal-containing electrode material 215A, while the gate electrode structure 210B may comprise a corresponding work function adjusting species 216B in combination with a metal-containing electrode material 215B. It should be appreciated that the materials 216A, 216B may be formed on the basis of any appropriate deposition and patterning regime in accordance with appropriate heat treatments, as may be required. Similarly, the electrode materials 215A, 215B, which may partly be the same material, may be applied by any appropriate process sequence, for instance by CVD, sputter deposition and the like, followed by the subsequent removal of any excess material on the basis of CMP.

As a result, the present disclosure provides techniques in which a placeholder material may be removed in a very late manufacturing stage on the basis of a highly uniform etch process since integrity of the placeholder material may be preserved by a dielectric cap material, in particular during a metal silicide process sequence. Moreover, enhanced process uniformity may be accomplished due to a superior matching of the gate height of different transistor types by appropriate adjusting the thickness of the dielectric cap layer of one type of transistor without affecting integrity of the dielectric cap layer of the other type of transistor, even if a pronounced over-etch time may be required. This may be accomplished by providing an efficient hard mask material for patterning offset spacer elements and adjusting the desired thickness of the dielectric cap material of one type of transistor while reliably covering the gate electrode of the other type of transistor in which the thickness of the dielectric cap material may have been reduced due to a previous exposure to a reactive process ambient.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a first gate electrode structure above a first semiconductor region of a semiconductor device and a second gate electrode structure above a second semiconductor region, said first and second gate electrode structures comprising a gate insulation layer including a high-k dielectric material, a placeholder material and a dielectric cap layer formed above said placeholder material;
forming a spacer layer above said first and second semiconductor regions and said first and second gate electrode structures;
forming a first offset spacer element selectively on said first gate electrode structure from said spacer layer;
forming a strain-inducing semiconductor alloy selectively in said first semiconductor region by using said first offset spacer element to adjust a lateral offset of said strain-inducing semiconductor alloy from said first gate electrode structure;
forming a hard mask so as to cover at least said first semiconductor region and said first gate electrode structure and expose at least a portion of said spacer layer formed above said second semiconductor region; and
forming a second offset spacer element from said spacer layer on said second gate electrode structure by using said hard mask as an etch mask.

2. The method of claim 1, further comprising forming drain and source regions in said first and second semiconductor regions and replacing said placeholder material of said first and second gate electrode structures with a conductive electrode material after forming said drain and source regions.

3. The method of claim 1, wherein forming said hard mask comprises forming a mask layer and selectively removing said mask layer from above said second semiconductor region and said second gate electrode structure.

4. The method of claim 3, wherein selectively removing said mask layer comprises performing a wet chemical etch process.

5. The method of claim 1, wherein forming said hard mask comprises forming a mask layer above said first and second semiconductor regions, masking said first semiconductor region and performing an anisotropic etch process so as to form a sacrificial spacer element at said second gate electrode structure.

6. The method of claim 5, wherein said second offset spacer element is formed by using said hard mask and said sacrificial spacer element.

7. The method of claim 1, further comprising adjusting a thickness of said dielectric cap layer of said second gate electrode structure by performing an etch process and using said hard mask as an etch mask.

8. The method of claim 1, further comprising forming metal silicide regions in said drain and source regions and using said dielectric cap layers of said first and second gate electrode structures and said first and second offset spacer elements as a silicidation mask.

9. The method of claim 1, wherein said mask layer is formed with a thickness of approximately 10 nm or less.

10. The method of claim 1, wherein said mask layer is formed on the basis of a silicon dioxide material.

11. The method of claim 1, further comprising forming a P-channel transistor in and above said first semiconductor region and forming an N-channel transistor in and above said second semiconductor region.

12. A method, comprising:
forming a mask layer above a first gate electrode structure and a second gate electrode structure of a semiconductor device, the second gate electrode structure being covered by a spacer layer, the first gate electrode structure comprising a first offset spacer element formed from said spacer layer;
selectively removing said mask layer from above said second gate electrode structure so as to form a hard mask covering said first gate electrode structure;
forming a second offset spacer element on said second gate electrode structure by using said hard mask as an etch mask;
adjusting a thickness of a sacrificial dielectric cap layer provided in said second gate electrode structure to a thickness of a sacrificial dielectric cap layer provided in said first gate electrode structure by performing an etch process in the presence of said hard mask; and
continuing a process sequence to form a first transistor and a second transistor on the basis of said first and second gate electrode structures comprising said sacrificial dielectric cap layers having the adjusted thickness.

13. The method of claim 12, wherein selectively removing said mask layer comprises performing a wet chemical etch process.

14. The method of claim 12, wherein said mask layer is formed with a thickness of approximately 10 nm or less.

15. The method of claim 12, wherein forming said first and second transistors comprises forming metal silicide regions in drain and source regions of said first and second transistors by using said sacrificial dielectric cap layers as a silicidation mask.

16. The method of claim 15, further comprising removing said sacrificial dielectric cap layers so as to expose material of said first and second gate electrode structures and replacing a portion of said first and second gate electrode structures with a conductive electrode material.

17. The method of claim 12, further comprising forming a strain-inducing semiconductor material in a semiconductor region having formed thereon said first gate electrode structure by using said first offset spacer element as an etch mask and a growth mask.

18. A method, comprising:
forming a mask layer above a first gate electrode structure and a second gate electrode structure of a semiconductor device, the second gate electrode structure being covered by a spacer layer, the first gate electrode structure comprising a first offset spacer element formed from said spacer layer;
forming a mask above said first gate electrode structure;
performing an anisotropic etch process to form a sacrificial spacer element on said mask layer that is formed on said second gate electrode structure;
forming a second offset spacer element on said second gate electrode structure by using said sacrificial spacer element and said mask layer formed above said first gate electrode structure as an etch mask;
adjusting a thickness of a sacrificial dielectric cap layer provided in said second gate electrode structure to a thickness of a sacrificial dielectric cap layer provided in said first gate electrode structure by performing an etch process in the presence of said mask layer and said sacrificial spacer element; and continuing a process sequence to form a first transistor and a second transistor on the basis of said first and second gate electrode structures comprising said sacrificial dielectric cap layers having the adjusted thickness.

19. The method of claim 18, wherein forming said first and second transistors comprises forming metal silicide regions in drain and source regions of said first and second transistors by using said sacrificial dielectric cap layers as a silicidation mask.

20. The method of claim 19, further comprising removing said sacrificial dielectric cap layers so as to expose material of said first and second gate electrode structures and replacing a portion of said first and second gate electrode structures with a metal-containing electrode material.

21. The method of claim 18, further comprising forming a strain-inducing semiconductor material in a semiconductor region having formed thereon said first gate electrode structure by using said first offset spacer element as an etch mask and a growth mask.

* * * * *